United States Patent

Soref et al.

Patent Number: 6,154,475
Date of Patent: Nov. 28, 2000

[54] SILICON-BASED STRAIN-SYMMETRIZED GE-SI QUANTUM LASERS

[75] Inventors: Richard A. Soref, Newton Centre; Lionel R. Friedman, Holden, both of Mass.

[73] Assignee: The United States of America as represented by the Secretary of the Air Force, Washington, D.C.

[21] Appl. No.: 08/984,857

[22] Filed: Dec. 4, 1997

[51] Int. Cl.[7] .................... H01S 3/19; H01L 29/06
[52] U.S. Cl. .................... 372/45; 372/44; 372/43; 372/50; 257/18; 257/19; 257/191
[58] Field of Search .................... 372/43, 44, 45, 372/46, 47, 48, 50, 96, 98; 257/14, 15, 18, 19, 191

[56] References Cited

U.S. PATENT DOCUMENTS

| | | | |
|---|---|---|---|
| 4,959,694 | 9/1990 | Gell | 257/18 X |
| 5,181,086 | 1/1993 | Yoshida | 257/18 |
| 5,221,413 | 6/1993 | Brasen et al. | 156/613 |
| 5,343,487 | 8/1994 | Scott et al. | 372/46 |
| 5,442,205 | 8/1995 | Brasen et al. | 257/191 |
| 5,499,259 | 3/1996 | Makita | 372/45 |
| 5,523,592 | 6/1996 | Nakagawa et al. | 257/96 |
| 5,528,614 | 6/1996 | Watanabe | 372/45 |
| 5,530,715 | 6/1996 | Shieh et al. | 372/96 |
| 5,550,854 | 8/1996 | Chen et al. | 372/45 |
| 5,570,386 | 10/1996 | Capasso et al. | 372/46 |
| 5,652,762 | 7/1997 | Otsuka et al. | 372/45 |
| 5,841,930 | 11/1998 | Kovacic et al. | 372/45 X |

Primary Examiner—Brian Healy
Attorney, Agent, or Firm—Robert L. Nathans

[57] ABSTRACT

A family of lasers is provided which can be readily grown upon silicon wafer platforms, each laser having a highly doped stably strained SiGe or Ge collector layer formed upon a SiGe graded relaxed buffer layer in turn grown on the Si wafer, and an intrinsic strain-symmetric Ge—Si superlattice covered by a heavily doped stably strained SiGe emitter. The superlattice has numerous thin 8–15 atomic monolayers of interleaved Ge and Si atoms, enabling high stack heights.

26 Claims, 11 Drawing Sheets

SILICON-BASED STRAIN-SYMMETRIZED GE-SI QUANTUM LASERS

STATEMENT OF GOVERNMENT INTEREST

The present invention may be made by or for the Government for governmental purposes without the payment of any royalty thereon.

BACKGROUND OF THE INVENTION

The present invention relates to the field of semiconductor lasers.

Silicon lasers do not exist at present, and are the "missing link" in Si photonics technology. New and practical Si laser designs are needed which, when implemented, will "complete" the Si photonics technology. Designs are especially wanted that "stay within Group IV"; that is, structures wherein 100% of the laser materials are made from some combination of the elemental semiconductors Si, Ge, C, Sn, structures whose fabrication is compatible with known Group IV epitaxy techniques and with monolithic integration on advanced silicon electronic integrated circuits.

Although workers skilled in silicon photonics have made vague suggestions that the quantum-well (QW) and superlattice (SL) approach is viable for silicon-based lasing, published specifics as to how this would be done are lacking.

Several patents exist on III-V semiconductor quantum-cascade lasers such as U.S. Pat. Nos. 5,570,386 and 5,509,025. However, it is not obvious to skilled workers how to construct a Group IV quantum cascade laser. The reason is that the phonon scattering properties and other relevant physical properties differ considerably between III-V and Group IV materials.

U.S. Pat. No. 5,442,205 (Brasen), U.S. Pat. No. 5,221,413 (Brasen), and U.S. Pat. No. 4,959,694 (Gell) have taught strained heterostructures consisting of pure Ge layers and pure Si layers grown upon a compositionally graded buffer layer of $Si_{1-x}Ge_x$ on a silicon substrate. The first two patents have taught this strained-layer system as a foundation for transistors and light emitting diodes, but not lasers. Thus, symmetrically strained Ge—Si/SiGe/Si "in-and-of itself" or as a foundation structure is known in the art. Rather, the focus of the present invention involves specific superlattice (SL) laser embodiments having p-SiGe tunnel injector-emitters, p-SiGe collectors and appropriate electrical pumping biases. The Gell patent teaches a strict relationship between the thickness of the Ge and Si layers and a specific $Si_{1-x}Ge_x$ buffer with >60% Ge, in order to produce a superlattice that has special "zone folding" properties which induce a direct bandgap between the valence and conduction minibands, whereas the bulk materials possess an indirect bandgap unsuitable for lasing. While the specialized superlattice of Gell might be employed for a band to band laser, his patent does not mention applications of optical transitions between valence minibands or between conduction minibands. Yet, those intersubband transitions are the exclusive focus of this patent and not band-to-band effects. In addition, we focus on $Si_{1-x}Ge_x$ buffers with less than 60% Ge, not more than 60%. The present invention also differs from Gell's teachings because we do not require his complex numeric relation between Ge and Si monolayers.

An invention disclosure of T. K. Gaylord et al., "Silicon-based optical emitters, detectors, modulators, and switches using bound and quasi-bound energy levels," Georgia Tech Record of Invention No. 1710 of Jun. 1, 1996, described in JSEP Annual Report for DAA H04-96-1-0161, describes a light emitter having an active gain region that employs $Si_{1-x}Ge_x$ alloys for quantum wells and $Si_{1-y}Ge_y$ alloys for barriers. In contrast, the present invention, with one exception, does not employ any alloys within the active gain region. The Georgia Tech invention disclosure teaches asymmetric strain in the active MQW, an asymmetry that we avoid. The Georgia Tech invention uses quasibound or above-barrier states, whereas the present invention uses bound states only, and thus also differs from U.S. Pat. No. 5,386,126 to G. N. Henderson et al., entitled "Semiconductor devices based on optical transitions between quasibound energy levels."

Workers in silicon photonics have written many papers on the Si-based asymmetrically strained system of $Si_{1-x}Ge_x$ quantum wells with unstrained Si barriers. The vague implication in these publications is that asymmetric SiGe/Si multiple-quantum wells (MQWS) could be useful for lasing. However, there is a basic problem with such systems that mitigates against their use in lasers: the height of a MQW stack of asymmetrically strained SiGe/Si is limited to a small height, about 30 nm due to the build-up of net strain in the MQW. The present invention solves this problem with symmetric strain in each period and net-zero strain in the MQW stack. This removes the height limit and allows stacks of 500 to 1000 nm.

Another problem with SiGe/Si is the <400 meV valence band offset, which restricts the intersubband optical transition wavelength to wavelengths longer than about 6 µm. In contrast, relatively short near-infrared wavelengths are allowed in the present Ge—Si invention due to the large 770 meV valence band offset in symmetric Ge—Si permitting intersubband lasing at wavelengths as short as 3 µm.

Another problem is the perceived need for coupled quantum wells in the active region of an intersubband laser. Most of the proposals floated for intersubband lasers (see the review in SPIE Proceedings, volume 2397) require coupled wells: a complex and difficult scheme to execute in practice. The present invention solves this problem by using a simple individual square well in each active period. The one-well structures are made possible by our local-in-k-space population inversion approach discussed below.

Another problem is that people do not know how to build a far-infrared laser (wavelengths of 30 to 100 µm or more) in any intersubband material, let alone in Group IV material. The present invention solves this problem by providing a long-wave Ge—Si staircase laser.

Another problem is: how can local-in-k population inversion be obtained in Si or Ge quantum wells? That problem is solved in accordance with the present invention with the aid of our detailed quantum-mechanical calculations of in-plane dispersion for Ge subbands.

BRIEF SUMMARY OF THE INVENTION

In accordance with a preferred embodiment of the invention a silicon-germanium graded relaxed buffer layer is formed upon a silicon platform with a highly doped stably strained SiGe or Ge collector layer formed over said silicon-germanium graded relaxed buffer layer and with an intrinsic strain-symmetric Ge—Si superlattice positioned over said germanium collector layer. A heavily doped SiGe emitter layer is positioned over said Ge—Si superlattice and the arrangement is forward biased for enabling light production by the laser. Each strain symmetric superlattice period of numerous stacked periods within the superlattice includes a thin layer of Ge of a thickness of between 8–15 atomic monolayers and a thin layer of Si having a thickness of between 8–15 atomic monolayers, and wherein each Ge layer is in compression and each Si layer is in tension. The superlattice preferrably includes a first silicon layer, in contact with the p-SiGe collector layer, thin enough for carrier tunnelling from the superlattice to the p-SiGe collector layer, and a second silicon layer, in contact with the p-SiGe emitter layer, thin enough for tunnelling of carriers from the emitter into the superlattice.

BRIEF DESCRIPTION OF THE DRAWINGS

The various features of the invention will become more apparent upon study of the detailed description, taken in conjunction with the following drawings in which.

DETAILED DESCRIPTION OF PREFERRED EMBODIMENTS OF THE INVENTION

The laser embodiments of the invention to be described in detail use heteroepitaxy of Ge and Si and SiGe on a bulk silicon, or silicon-on-insulator (SOI) or an (SOS) substrate, where the growth upon the Si/SOI/SOS platform is performed by molecular beam epitaxy (MBE) or chemical vapor deposition (CVD). The cross-section arrangement of the heteroepitaxial layers is approximately the same for all five disclosed lasers. Although vertical cavity surface-emitting lasers (VCSELs) are feasible within the present invention, we concentrate here on waveguided lasers. The VCSELS are more complex in the sense that they require multilayer dielectric mirror stacks above and below the superlattice gain stack. There are several types of laser resonators that should perform well in accordance with the present invention: (1) micro cavity resonators in SOI/SOS strip waveguides that utilize photonic bandgap reflectors or deeply etched Bragg reflectors, (2) a rib or ridge-waveguide with a distributed Bragg reflector (DBR) or distributed feedback (DFB) surface corrugation mirror, (3) a rib waveguide with cleaved or etched end-mirrors forming a Fabry Perot resonator. For perspective views of waveguided laser resonators see FIG. 6 of Soref (Thin Solid Films, UK, vol. 294 p 329, 1997) and FIGS. 6 and 9 of Soref et al (Superlattices and Microstructures, volume 22, no. 4, 1997).

Figure 1:
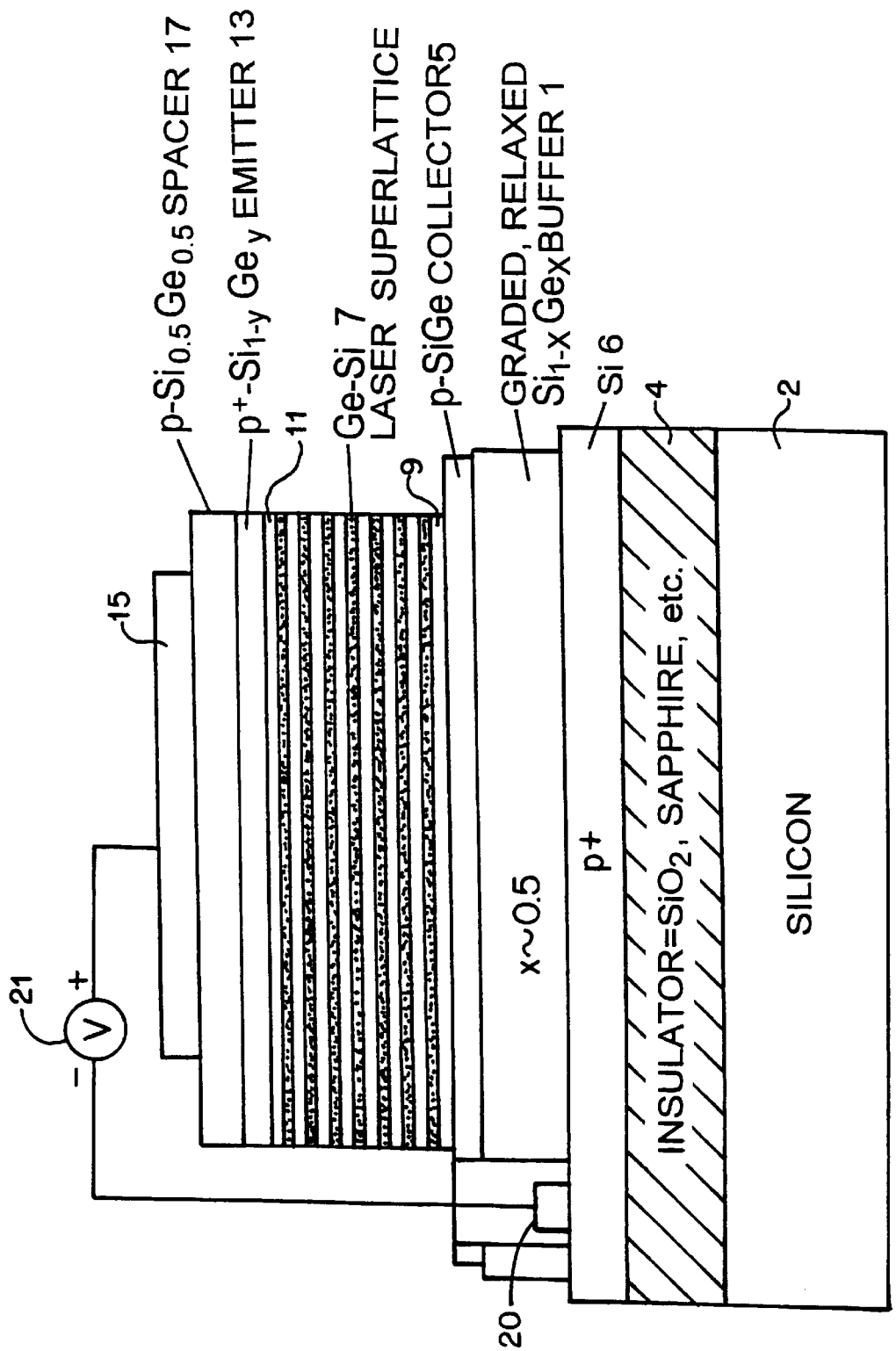
FIG. 1 illustrates a cross-section view of Ge—Si p-i-p waveguided laser on SOI/SOS platform.

We show in FIG. 1 the cross-section view of a p-i-p unipolar laser embodiment of our invention. The starting wafer is an SOI or SOS wafer. The SOI/SOS advantages are: (1) tight confinement of optical modes in epitaxial superlattice waveguide, (2) strong overlap of the fundamental guided mode with the optical gain regions of the superlattice, (3) high Q optical resonator, (4) low electrical impedance for the p-i-p laser diode, because the thick Si substrate is not in series with the laser diode.

The first step is to grow a graded index buffer layer 1, also known as a virtual substrate, upon the SOI/SOS platform 3, which includes silicon base 2, insulator 4 and silicon layer 6. The insulator could consist of sapphire, silicon dioxide or the like. This $Si_{1-x}Ge_x$ graded relaxed buffer layer 1 is relatively thick, approx 1–2 $\mu$m, with a thickness larger than the critical thickness for stable strain, making this layer relaxed or strain-relieved. Its composition may vary linearly, or in steps, from Si up to $Si_{1-x}Ge_x$ where x is about 0.5, but could extend up to 60 percent Ge. This layer has very few defects per square-cm at its top surface, so its top surface presents an excellent surface for Ge and Si growth. The lattice parameter of the buffer is about 5.545, midway between Si and Ge. FIG. 1 shows the emitter-up geometry, although emitter-down geometry, mentioned below, is feasible.

In the emitter-up case, a highly doped 4-nm p-type $Si_{0.5}Ge_{0.5}$ stably strained layer 5, the collector contact of the laser, is grown upon the buffer. This is one of two electrical contacts of the p-i-p diode. Following that, the undoped, strain-symmetric Ge—Si superlattice 7 is grown upon the collector 5. The superlattice (SL) constitutes the intrinsic region of the diode. In some cases the SL will be lightly doped to avoid space charge effects in the SL. The superlattice is constructed so that the layer adjacent to the p-SiGe collector 5 is a first Si layer 9, thin enough (1.0–1.5 nm) for tunneling from the SL to the collector. The top layer 11 of the SL is a second thin Si layer through which holes can thus tunnel into the active SL from the emitter 13. A heavily doped stably strained p-type $Si_{1-y}Ge_y$ emitter/injector layer 13, the second electrical contact, is grown upon the SL (y is roughly 0.5). The forward-biased p-i-p laser diode is capable of injecting carrier holes into an upper subband of the SL such as miniband-HH2. The emitter 13 would be a 10 to 15 nm pseudomorphic layer (thickness <20 nm, the critical thickness for stable strain of the y alloy with respect to the x alloy, where y-x 0.1). Generally, a thin p$^+$ injector layer is preferred to a "thick" layer such as 400 nm in thickness because the injector overlaps the tail of the guided mode, and a reduction in injector thickness reduces waveguide losses (the tail of the guided optical mode intersects a smaller volume of absorbing free carriers in a thinner layer). To reduce the optical attenuation effects produced by a metallic contact layer on top of the laser waveguide and directly on the p$^+$ emitter 13, an optional dielectric spacer layer 17 can be interposed. This is a one micron thick lattice-matched p-type $Si_{0.5}Ge_{0.5}$ waveguide-cladding layer as shown. Finally, a conductive metal or poly-Si rectangular electrode 15 is deposited upon the top of the laser stack to be connected to voltage biasing source 21 as shown. With reactive ion etching or focussed ion-beam etching, it is necessary to etch the SL, the emitter, and the upper cladding into a strip-shape in order to form a strip optical waveguide for this laser.

For providing the second laser contact, two techniques may be employed. In the first method, the p-type SiGe collector layer (p=3×10$^{18}$ cm$^{-3}$) becomes exposed on a side region during the waveguide etch. The lower metallic contact 20 to the laser stack is deposited on this plateau, and is connected to the other side of source 21. In the second preferred technique, a p-type layer of Si ($p=3\times10^{18}$ cm$^{-3}$) is used for SOI layer 6, and a trench, shown in the figure is etched through the collector and buffer layers down to the p-silicon, so that the metallic contact 20 touches layer 6 and no other layers. Equally useful for lasing is the emitter-down case, where the locations of the collector and emitter are interchanged in FIG. 1, and the polarity of the foward biased diode is reversed relative to FIG. 1. For this structure, there is a choice of contacting the emitter layer directly, or making a trench throught the emitter and buffer and then contacting p-Si 6 only.

Figure 2:
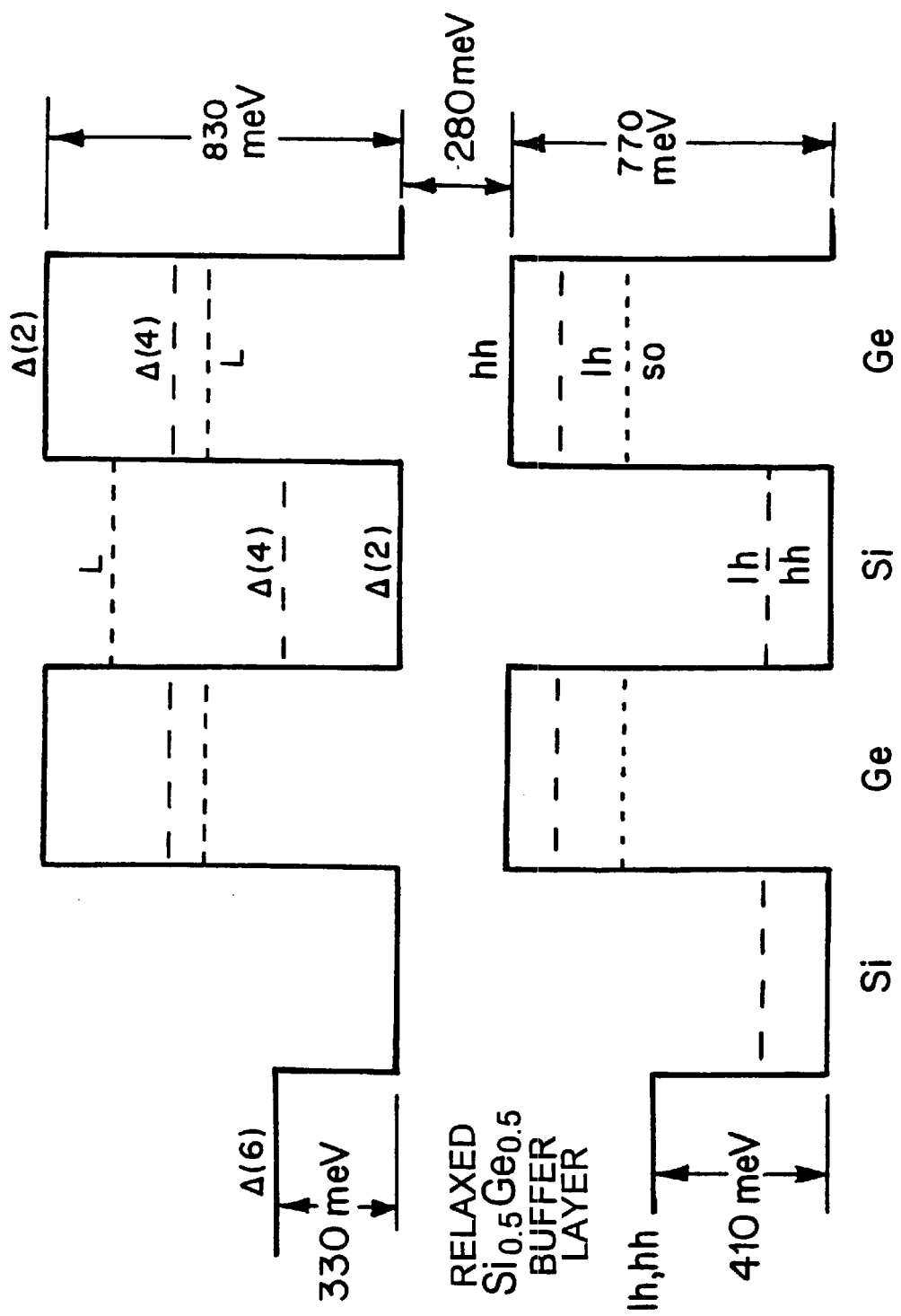
FIG. 2 illustrates bandedge energies of a symmetrically strained Ge—Si superlattice, compressive Ge and tensile Si, upon a graded relaxed SiGe buffer.

To understand laser operation, we need to know the band offsets and the band alignments of the strain-symmetrized Ge—Si atomic layer superlattice 7 on the relaxed (100) $Si_{0.5}Ge_{0.5}$ buffer layer 1. This is illustrated in FIG. 2. In Ge—Si lasers, we would typically use 10 monolayers (ML) of Ge and 10 monolayers of Si, or more generally 8 to 15 ML of each for each period of the numerous stacked periods of the SL. The Ge—Si SL has Type II band alignment with holes confined in Ge QWs and electrons confined in Si QWs. Although we provide specific features of valence subband lasers, Ge—Si intersubband lasing is equally feasible between silicon conduction subbands $X_1$, $X_2$ etc., in which electrons are injected, and those lasers will have structure very similar to the ones presented here. We do not, at the moment, possess in-plane conduction dispersion diagrams for the Si QWs, and thus cannot offer specifics for the conduction case—although those specifics could be easily given once the diagrams are generated.

Quantum Cascade Laser (QCL)

Figure 3:
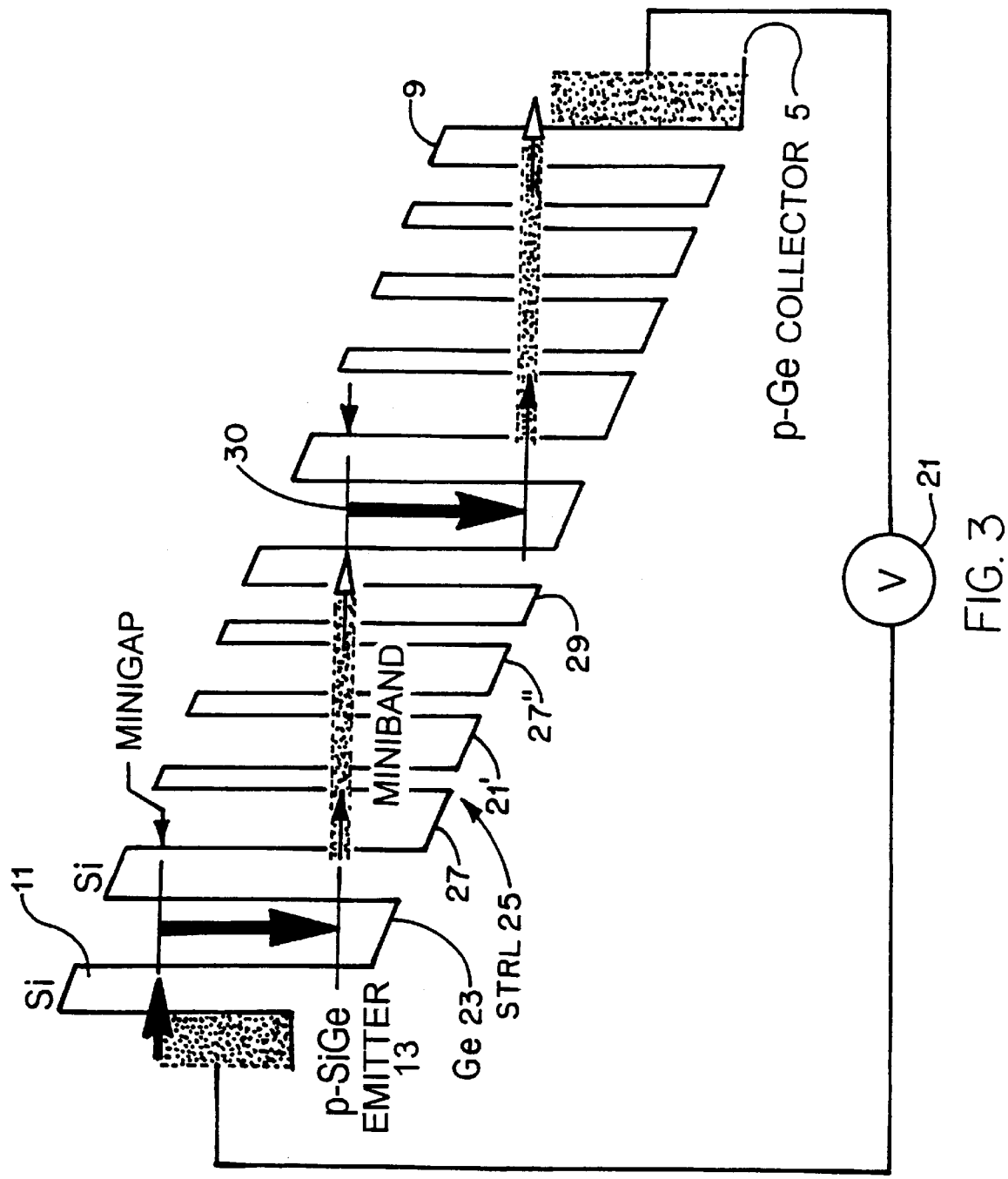
FIG. 3 shows a Ge—Si quantum cascade laser.
Figure 3A:
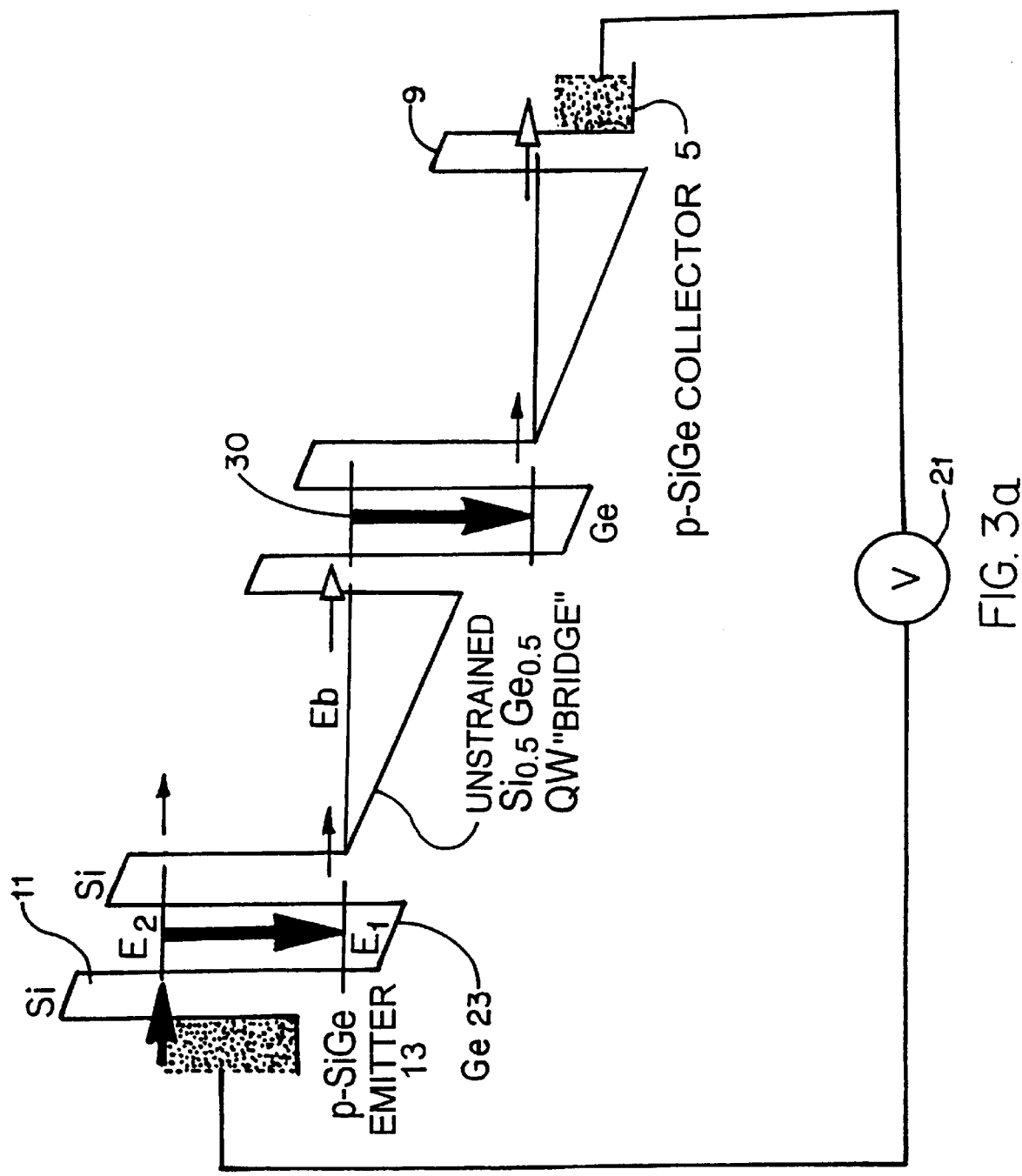
FIG. 3a shows a simplified GeSi quantum cascade laser.

FIG. 3 shows the valence bandedge energy diagram of the p-i-p Ge—Si quantum cascade laser during an electric field bias provided by pumping voltage source 21. There are N identical periods. Each period consists of a single undoped Ge quantum well 23, the active region, plus a superlattice transfer region (SLTR) 25 with varying width quantum wells, namely 27, 27', 27" and 29, that are digitally graded. The SLTR may contain light p-doping to reduce space charge effects. At the correct bias voltage, $V_a$Nhv volts, where hv is the laser photon energy, the lowest QW levels in the SLTR 25 all resonate and couple so as to provide miniband transport of holes from the lower subband of the laser's active QW to the upper subband of the next laser QW in the adjacent period 31. The SLTR has a mini-gap located at the upper subband of the first-period QW which blocks (reflects) carriers in the upper subband, preventing them from escaping laterally via tunneling. As in FIG. 1, there is a 1.0 to 1.5 nm Si tunnel barrier, 11 and 9 of FIG. 1, at the p-SiGe injector 13 and at the p-SiGe collector 5, respectively. In this QCL we would typically use local-in-$k_x$ population inversion at the Gamma point of HH2 (the upper laser subband) with respect to HH1 (the lower laser subband). For selective tunneling into HH2, the HH valence offset of the $Si_{1-y}Ge_y$ emitter is required to be 300 to 400 meV above the Ge bandedge; thus we can choose y close to 50%, similar to x of the buffer. Note that the SiGe alloy is at the periphery of the active region, not inside it. The HH2-HH1 laser light is polarized TM-like in a channel waveguide, and the lasing wavelengths for this QCL would be in the 3.5 to 10 $\mu$m wavelength range. Cryogenic cooling would probably be required for 5 to 10 $\mu$m cw operation. Room temperature operation may be suitable for pulsed lasing, especially at the 3.5 to 5 $\mu$m range. The graded-width SLTRs 25 are not perfectly strain-symmetrized due to the varying widths of the Ge QWs within them (the Si barriers are generally fixed at about a 1.2 nm width). Hence, a small amount of strain builds up within the SLTRs, and the net strain will limit the number of periods N in the QCL as well as the height of the MQW waveguide. However, the height limit is not severe in the sense that a 500 nm MQW appears feasible. It may be possible to compensate for this by choosing the x of the buffer layer to deviate somewhat from 0.5. Since the SLTRs are complicated, we illustrate a simplified QCL that eliminates SLTRs and replaces each one by a wide unrestrained $Si_{1-x}Ge_x$ quantum well whose composition x is about the same as that of the buffer, where the width w equals hv/eF, where hv is the laser photon energy. This p-i-p QCL is shown in FIG. 3a with the SiGe QW bridges (QWTRs) between active regions. The structure is designed so that, at a particular applied field strength, the lower laser level $E_1$ becomes resonant with the lowest bridge state $E_{b1}$ giving HH2–HH1 hole transfer, and the bridge level indicated $E_1$, $E_2$ and $E_b$ in FIG. 3a, resonates with the upper laser-state $E_2$ in the next period, giving $E_b$–$E_2$ transfer as shown. A potential problem is leakage from $E_2$ into continuum states. The QWTRs are doped $1\times10^{17}$ cm$^{-3}$ with acceptors so that the fixed negative ionic charge neutralizes the ambient hole charge, preventing space charge buildup. Unfortunately, in this particular laser, SiGe alloys are present in the gain region, but the wells are easy to grow. However, with suitable choices of the Si and Ge layer thickness in the active region, the laser stack has zero net strain, as before.

Figure 4:
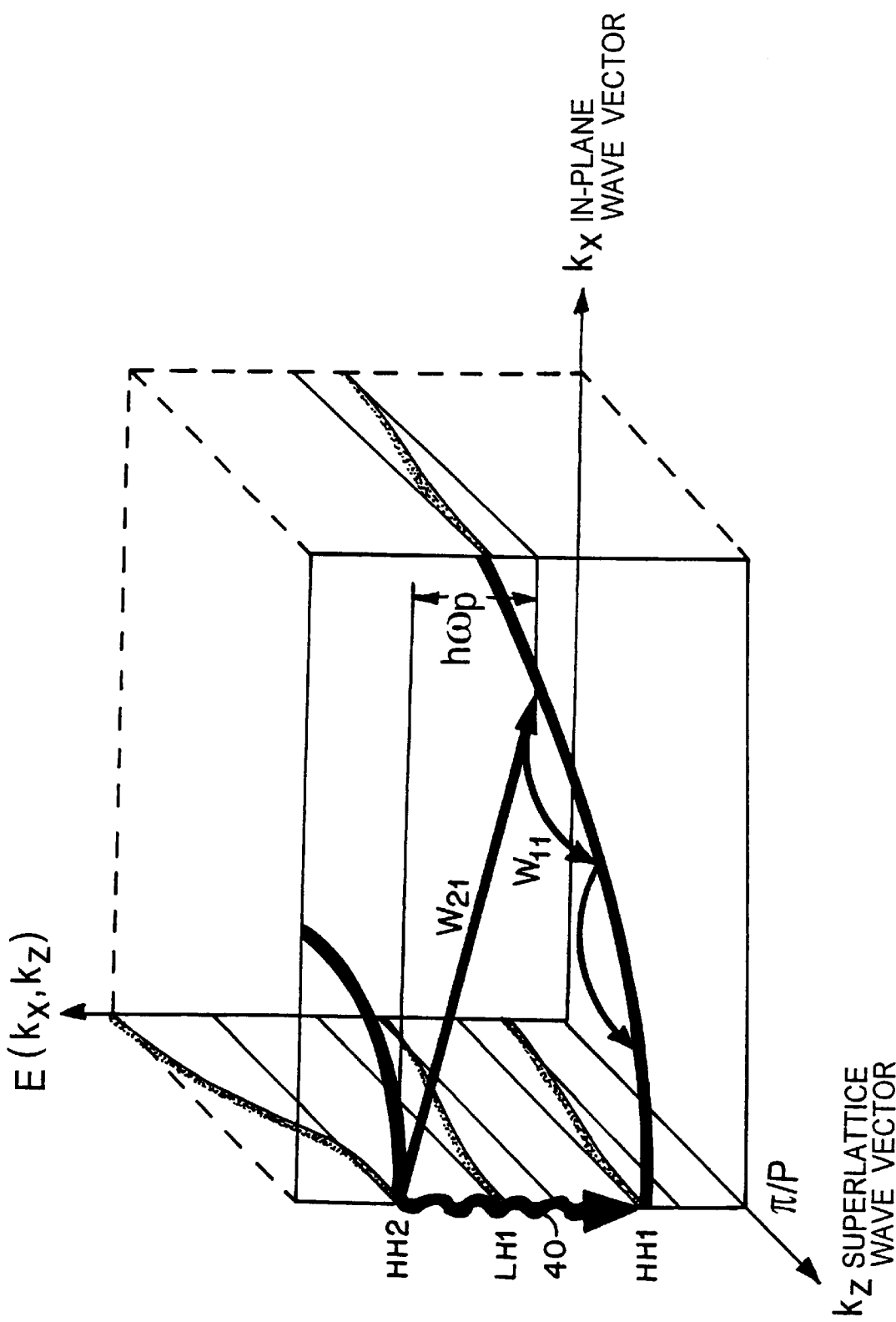
FIG. 4 indicates local-in-k-space HH2–HH1 population inversion of a $Ge_{0.5}Si_{0.5}$/Si superlattice. In-plane dispersion of valence subbands at SL mini-zone boundary is shown.
Figure 5:
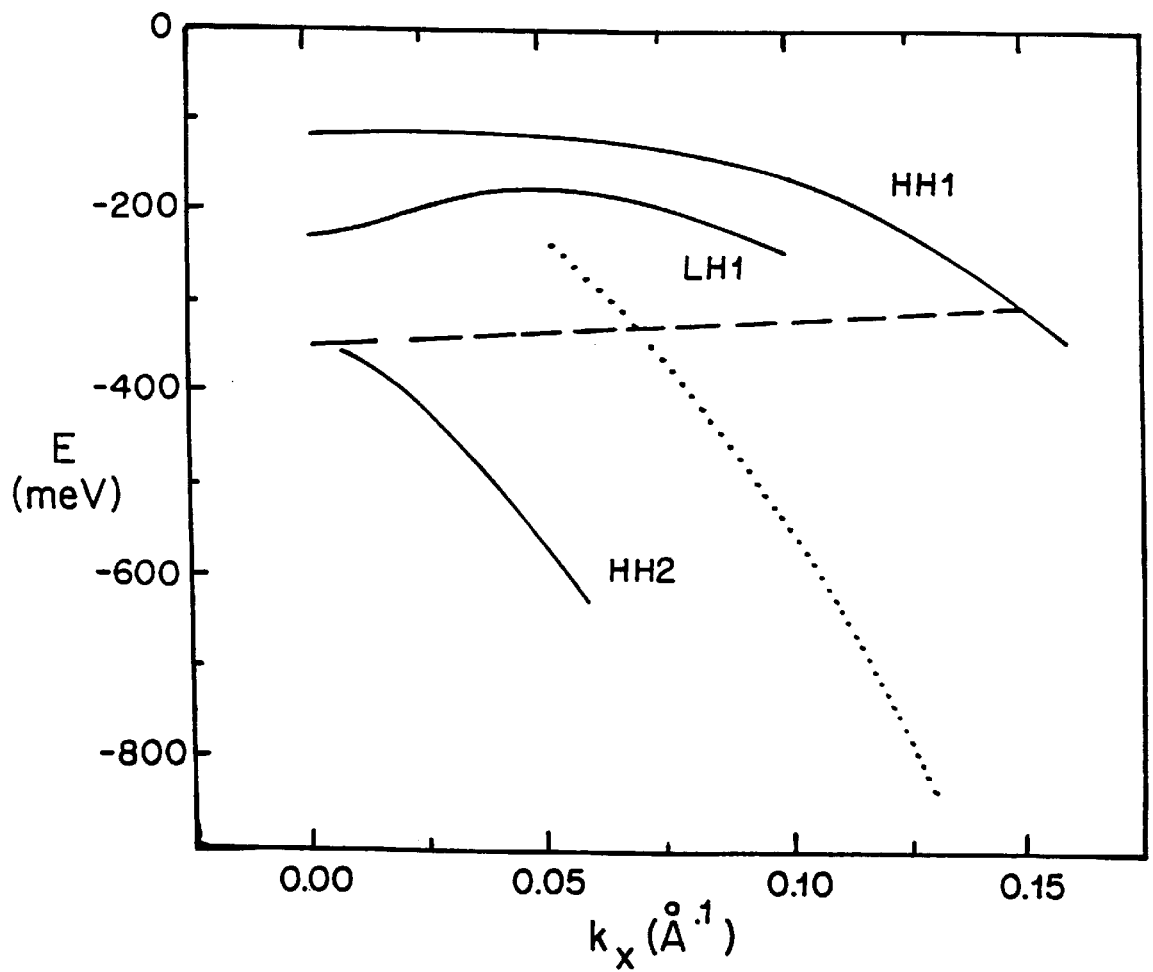
FIG. 5 indicates in-plane valence dispersion of $Ge_{0.5}Si_{0.5}$/Si superlattice at $k_z=\pi/P$. Dotted lines show non-interacting subbands. Solid lines show the subbands with band interaction included. Dashed line shows intersubband phonon transition.
Figure 6:
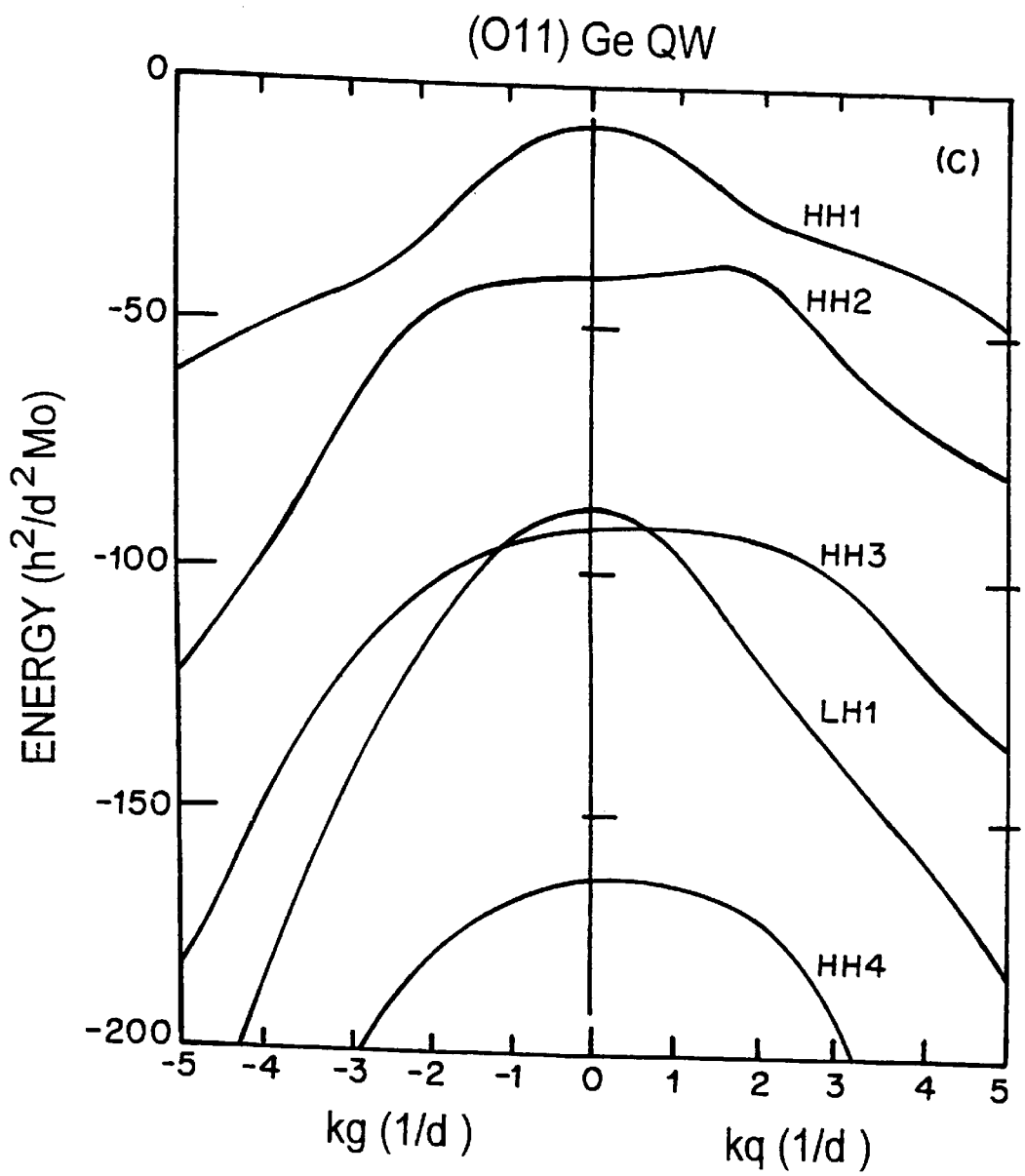
FIG. 6 shows in-plane valence dispersion of strained (110) Ge QW with high barriers.
Figure 7:
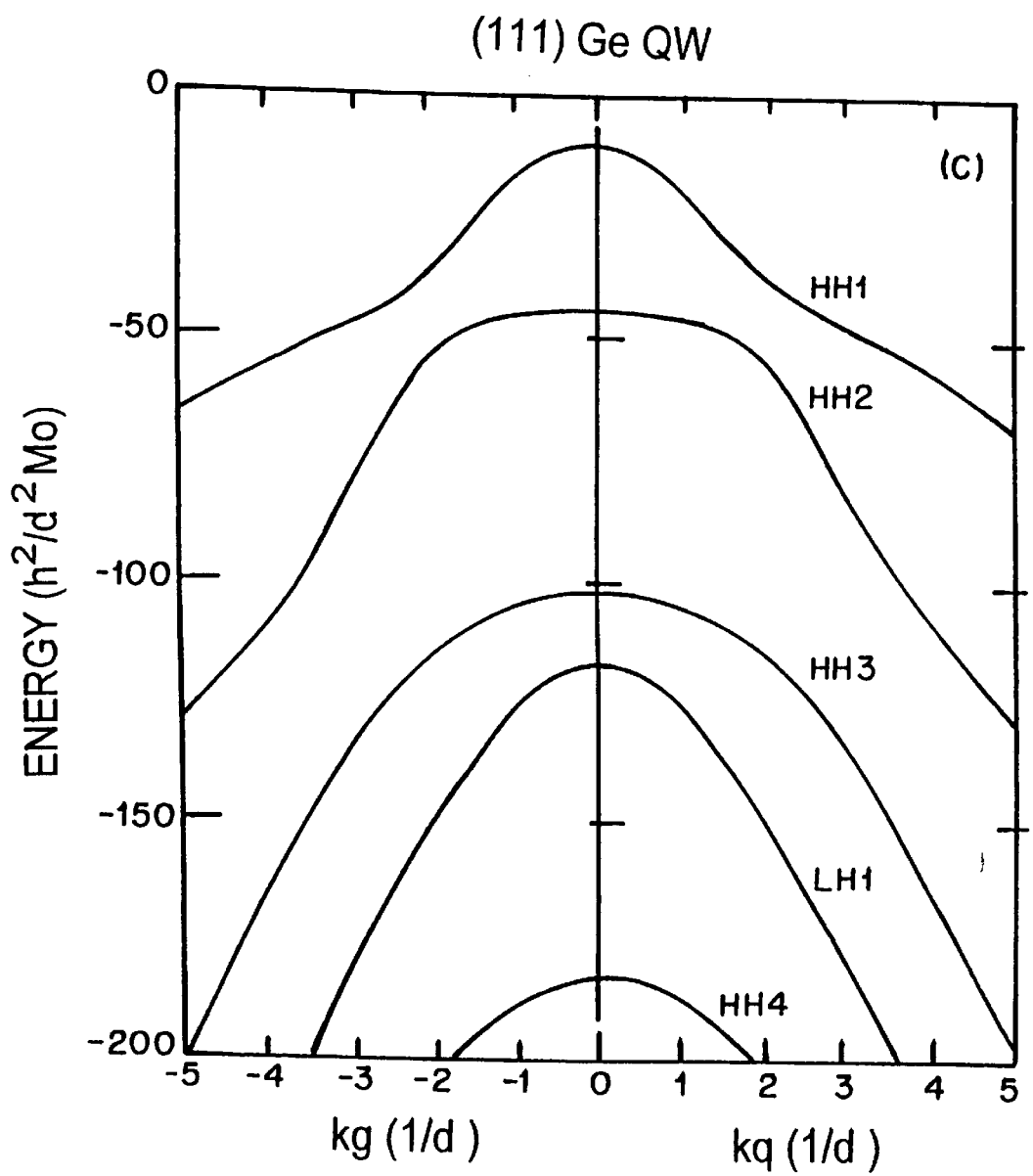
FIG. 7 shows in-plane valence dispersion of strained (111) Ge QW with high barriers.

All five laser embodiments of the invention use only two active subbands within a QW or only two active minibands within an SL. Lasing is feasible on this two-level system which is actually equivalent to a three- or four-level system. To understand the laser action, we must begin with the QW in-plane dispersion diagram: either for the valence subbands, or for the SL valence minibands. The former is the band energy as a function of wave vector $k_x$ or $k_y$, where x and y are unconfined directions. The latter is the band energy versus $k_x$, $h_y$, and the superlattice wave vector $k_z$ where z is the layer growth direction. We present in FIGS. 4 and 5 detailed results of a quantum-mechanical calculation for a compressive $Si_{0.5}Ge_{0.5}$ QWs between unstrained Si barriers. FIGS. 6 and 7 indicate the calculated dispersion of valence subbands in strained Ge QW with infinite barriers (Schecter et al, Physical Review B, vol. 51, 10875, 1995) for the 110 and 111 orientations. It is presently believed that nonparabolic bandshapes exist in the strained Ge (or Si) dispersion curves. Quantum mechanical analysis shows that this is always true.

Knowing the dispersion, we then perform laser "lifetime engineering" to assure ourselves that the effective lifetime of the pumped upper state is longer than the lifetime of the lower state, giving an inverted population of holes as desired. The lifetimes are determined from an analysis of phonon scattering processes from the excited state to the lower state. For example, in FIG. 4, assuming selective injection into the bottom of MB-HH2 at $k_x=0$, we see that those holes fall rapidly to the mini-zone boundary at $k_z=\pi/P$, where they scatter radiatively and non-radiatively. The vertical-in-k HH2-HH1 radiation is shown by the wavy arrow 40, TM polarized in a waveguide. The HH2-LH1 radiation has the orthogonal polarization, and is weak. Generally, the intervening LH1 level decreases the inversion strength but does not destroy it. The emission of an LO phonon from HH2 to HH1 is shown by the $W_{21}$ arrow 42. Holes transfered this way to HH1 are depleted very rapidly by the intra-miniband phonon cascade 44 as shown. While cascading down, the holes can tunnel to the collector, thereby decreasing the effective lifetime of HH1, and hence enhancing the local population inversion.

The non-parabolic shapes result from band mixing. In their un-mixed states the bands tend to cross, but the full mixing analysis shows that bands actually anti-cross and repel in certain k-regions. The unusual non-parabolic shapes of HH2, HH1 in FIGS. 4–7 mean that the active bands do not run parallel to each other, and therefore that photons emitted at a local region of k space such as the gamma point for FIGS. 3 and 3a, will not be re-absorbed (self-absorbed) by the QW at other points in k-space outside the local zone. That maintains the local population inversion, as desired. If the bands were parabolic and parallel, then re-absorption of the emitted photons would occur everywhere in the zone, destroying the population inversion.

Faist and co-workers have given an "existence theorem" for two-subband lasing in the conduction band (Physical Review Letters, vol. 76, 411, 1996) where they showed "lasing without inversion" in III-V semiconductors; the inversion is not global (integrated over both bands) but is actually a population inversion localized at $k_x=0$.

Quantum Parallel Laser

Figure 8:
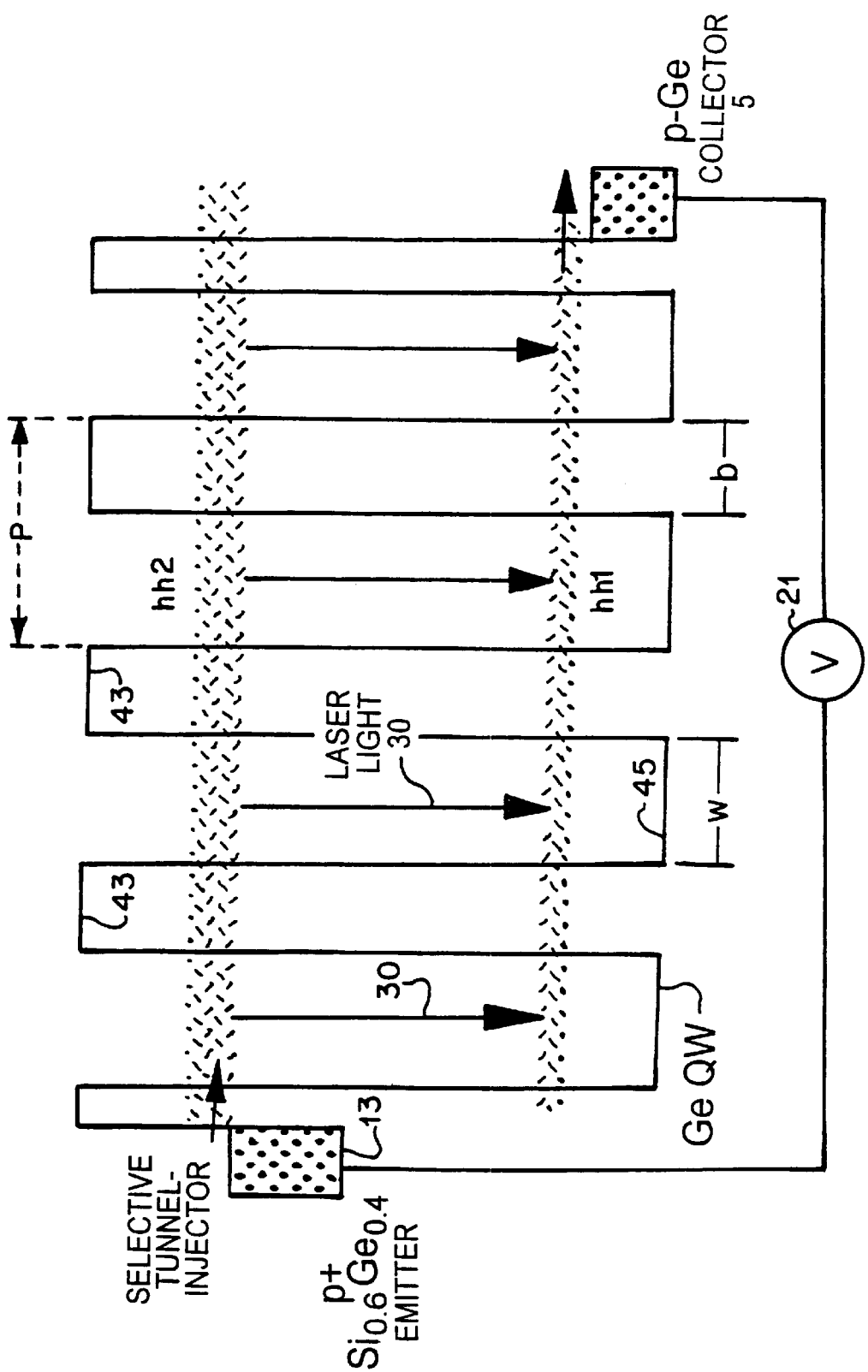
FIG. 8 illustrates a Ge—Si quantum parallel laser.

The QPL of FIG. 8 is a SL inter-miniband laser comprised of identical square wells 45 closely coupled to each other through identical, thin Si tunnel barriers 43. Voltage source 21, emitter 13, and collector 5 function as in the prior embodiments, and the equal width Ge and Si layers are each in the 8–15 monolayer range. Holes are injected into the bottom of MB-HH2, rather than into the middle of MB-HH2 because the group velocity of holes in the MB-center is "too high" in the sense that these holes traverse the SL so rapidly that the fraction of input carriers making radiative (laser) transitions is decreased. The QPL operates under a flat band condition in which the built-in electric field (due to the work function difference between the p-emitter material and the p-collector material) is exactly canceled by the opposing applied bias field. This is a low-voltage laser since the desired flat-band voltage is about 0.4 volts. As in the QCL of FIG. 3, the injector composition is in the $Si_{0.6}Ge_{0.4}$ to $Si_{0.5}Ge_{0.5}$ range, while the collector is p-SiGe. Some adjustment of well and barrier width can be made, while retaining strain symmetrization, through the procedure of changing the buffer composition slightly from x=0.5. Net zero strain is retained by making $t_{(well)}*strain_{(well)}=-t_{(barrier)}*strain_{(barrier)}$ where t=thickness. This is a room-temperature laser for the 3.5 to 10 $\mu$m range. Two reasons explain the room-temperature operation: (1) negligible thermal excitation of holes from HH1 to HH2 (hv>>kT), and negligible promotion of holes from the bottom of MB-HH2 to the middle of MB-HH2. The spatial non-uniformity of gain in the laser (high gain near the emitter, low gain near the collector) is not a problem because the waveguide modal pattern averages over the non-uniform gain profile.

Cacaded Superlattice Laser

Figure 9:
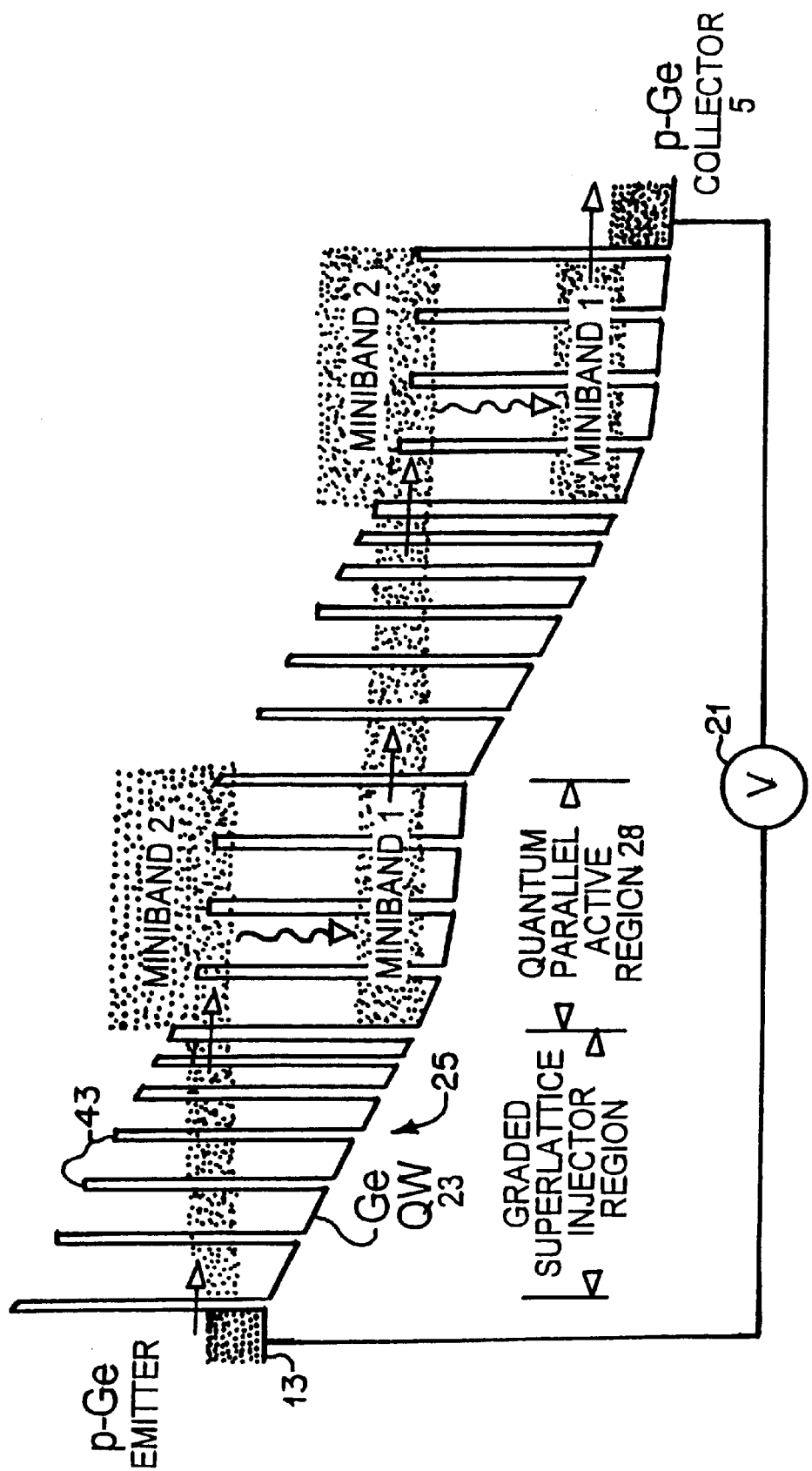
FIG. 9 illustrates a Ge—Si cascaded superlattice laser.

If the MBE growth apparatus in a particular laboratory is not sophisticated enough to produce a coherence length longer than 20 nm for the QPL, and if a gain region thicker than 200 nm is wanted, then it will be advantageous to combine a sequence of "short" QPL gain regions by merging the QPL and QCL geometries. In other words, a cascade laser can be constructed in which the SLTRs remain the same as in the FIG.-3 QCL, but where the active zones become quantum-parallel superlattices. This Ge—Si cacaded superlattice laser is shown in FIG. 9. This design is generically similar to the III-V semiconductor structure shown in FIG. 1 of Scamarcio (Science, vol. 276, p. 773, 1997). The voltage drop across the SLTR, produced by voltage source 21 via emitter 13 and collector 5, tends to self-stabilize at the miniband formation voltage, and that voltage is approximately $V_a/N$. In other words, most of the applied voltage drops across the SLTRs 25 and very little voltage is present across the nearly flat-band quantum-parallel regions 28. This is because of the doping in the SLTR region required to neutralize any space charge.

Staircase Laser

Figure 10:
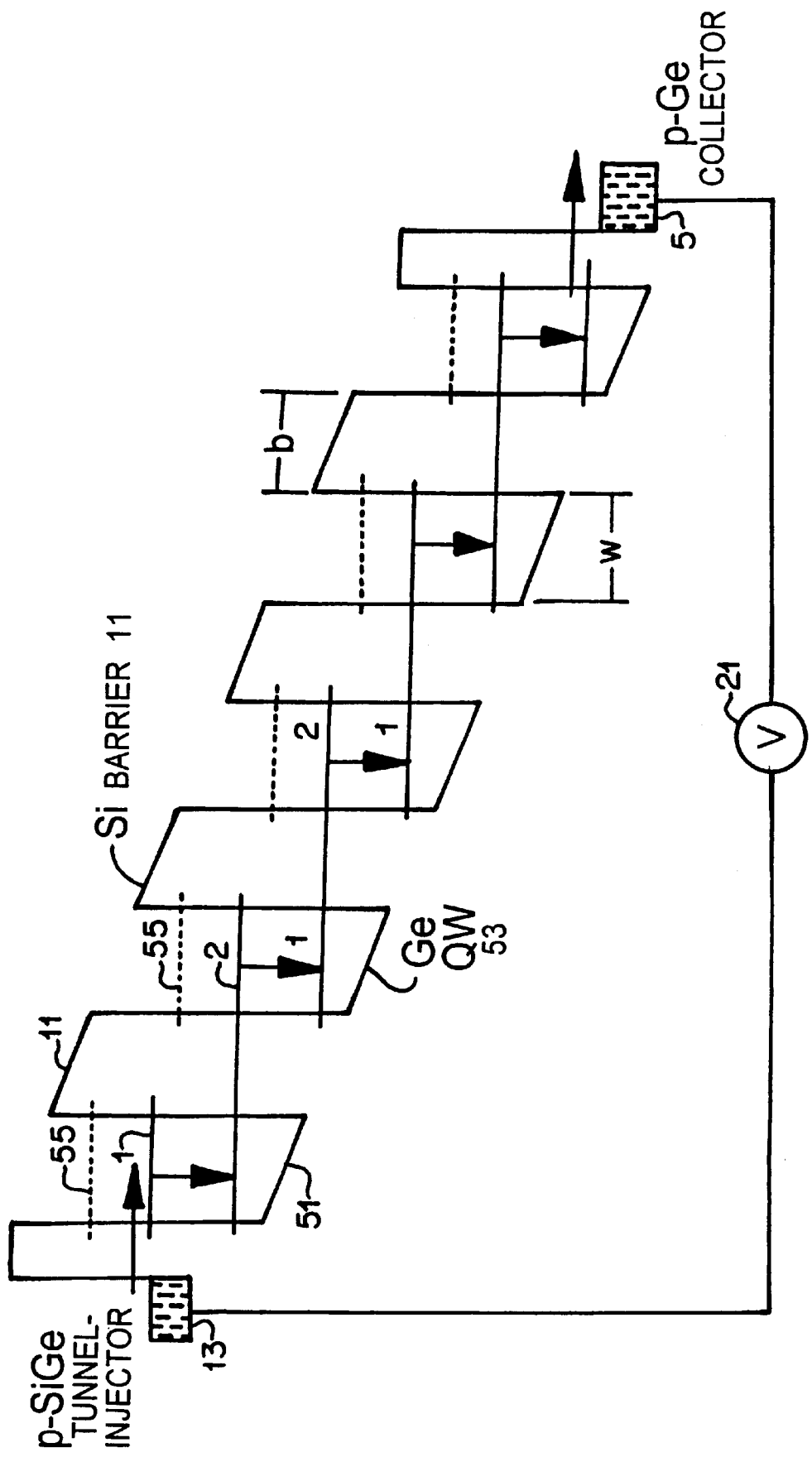
FIG. 10 illustrates a Ge—Si strain-symmetric staircase laser.

Regarding our staircase laser of FIG. 10, the 30 to 100 $\mu$m far infrared region overlaps with the terahertz region (1 to 10 THz corresponds to 30 to 300 $\mu$m) and light sources are generally not available here, apart from the p-type bulk-Ge hot-hole laser that requires crossed magnetic and electric fields. Our far-infrared 30–100 $\mu$m laser invention dispenses with magnetic fields and uses simple electrical injection pumping only. As before, the staircase laser is a Si-based epitaxial Ge—Si structure. It is a simplified version of the quantum cascade of FIG. 3 above. Because of the small photon energy <40 meV, we are able to eliminate the complex superlattice transfer regions in FIG. 3 and to evolve the design towards the simpler staircase QW geometries proposed in the 1970's and 1980's for III-Vs, as reviewed by Afzali-Kushaa and Haddad (SPIE Proceedings, vol. 2397, page 476, Feb. 6, 1995). Our Group IV structure is a modified and improved version of Liu's III-V superlattice (Journal of Applied Physics, vol. 63, 2856, 1988) and is a highly simplified version of the III-V emitter of Xu et al (Applied Physics Letters, vol. 71, p. 440, Jul. 28, 1997). This embodiment of the invention differs significantly from Xu's arrangement because Xu's three coupled QWs are replaced by a single QW 51, and Xu's three active subbands are replaced by two subbands. Liu incorrectly stated that global population inversion throughout the Brillouin zone was feasible between two adjacent minibands. We have corrected this error by demonstrating via calculations the above-discussed local-in-k inversion.

Our 30 to 100 $\mu$m symmetrically strained p-i-p superlattice staircase laser of FIG. 10 has two active subbands with selective injection into subband-2 at the $\Gamma$ point of the BZ. This SL has w=b, with b=2 nm typically. This is a resonant tunneling intersubband device and the 1.5 to 2.0 nm Si thickness promotes efficient tunneling. At the desired value of applied electric field, subband-S1 of the first well 51 locks into resonance with subband-2 of the second well, etc, and carriers that cascade down to subband-1 in the first well are transferred laterally into the upper laser level of the second well via tunneling through Si. The dotted line 55 symbolizes a higher un-excited subband (it represents all of the higher subbands) and we showed the higher level in this diagram to illustrate that level 2 in any QW does not come into resonance with any subband of the next well, including quasi-bound or continuum levels in the next well. Here P=w+b=2w, and the electric field in the laser is F=hv/eP. Taking hv=40 meV and w=2 nm (a maximum value), then F=100 kV/cm; so 40 meV is probably an upper limit. The applied voltage, produced by voltage source 21, via emitter 13 and collector 5, is Nhv, a low voltage. This laser would require cryogenic cooling, at about 10 to 77 K, for proper operation. It is worth noting that the staircase laser will work with three active subbands in the active Ge QW; that is, lasing from subband SB3 to subband SB2, and rapid relaxation from SB2 to subband SB1, aided by choosing the 2-1 energy difference to be slightly greater than the LO phonon energy. In this case, carriers tunnel out from level 1 of QW 51 to level SB3 of QW-53.

Greg Sun and Jacob Khurgin in unpublished work have suggested the LH1-to-HH1 transition in GaAs and SiGe-alloy QWs for far-infrared lasing. Since HH2 lies lower in energy than LH1 in Ge as shown in FIG. 6 and 7, we shall instead propose the HH2-HH1 transition in Ge for the FIG.-10 laser. After selective electrical injection into HH2 at Γ, the holes relax rapidly the the HH2 anti-crossing minimum where they radiate (in the far infrared) to the HH1 subband. Thereupon the holes relax very quickly to the HH1 minimum at Γ. That light is TM-polarized in a strip waveguide. Three-subband schemes are also useful for the FIG. 10 laser, such as selective injection into LH1 or HH3, with TE-polarized LH1-HH2 radiation or TM-polarized HH3-HH2 radiation.

If the laser's photon energy cannot be adjusted (tuned) sufficiently by adjusting the well width in the w=b scheme, one could use unequal-width wells and barriers, provided that the buffer composition were changed: for example, a 60/40 Si/Ge buffer would allow w=1.5 b in FIG. 10. This arrangement assures net-zero strain in the SL because the condition $t_w S_w = -t_b S_b$ is maintained.

In sum, practical Ge—Si infrared laser designs for $\lambda$=3 to 100 $\mu$m wavelength are given for the quantum cascade laser, the quantum parallel laser, the cascaded superlattice laser, and the staircase laser. All four unipolar p-i-p lasers use strain-symmetrized Ge—Si atomic-layer superlattices grown upon a relaxed, compositionally graded buffer layer of $Si_{1-x}Ge_x$ (x 0.5) upon an SOI or SOS substrate. All four use local-in-k-space population inversion between two non-parabolic valence subbands (or between valence minibands) within simple square Ge quantum wells. It is also feasible to use conduction intersubband transitions within Si quantum wells for the local inversion in these electrically pumped lasers. These heteroepitaxial lasers can be monolithically integrated with silicon micro-electronic and nano-electronic ICs.

The described preferred laser embodiments are: (1) silicon based, (2) grown on a SOI or SOS wafer, (3) unipolar p-i-p or n-i-n diode, (4) capable of monolithic integration with advanced silicon electronic integrated circuits, (5) made of strain- symmetrized layers that allow a thick superlattice stack, a stack useful in waveguides, (6) made of layers relatively free from dislocations or other defects, (7) made of elemental semiconductors in active region—eliminating alloy scattering—allowing narrower linewidths and eliminating compositional rounding of quantum wells, (8) simple structures that use only one quantum well in each period and two active subbands—or two active minibands—together with a local-in-k population inversion, (9) suitable for integration in SOI/SOS submicroncrosssection strip waveguides, or in rib waveguides, (10) capable of TE-like emission as well as TM-like lasing, (11) tunable by design, (12) operable as GHz-speed LEDs at injection currents below the oscillation threshold, (13) well confined optically with high Q resonators, (14) made with p-SiGe emitters and p-SiGe collectors.

Novel features of quantum cascade laser: (1) the geometry of the waveguided laser can be scaled from sub-micron dimensions (low power OEIC operation) to multi-micron dimensions for high-power pulsed operation, (2) 4 to 12 $\mu$m operation.

Novel features of quantum parallel laser: (1) low-voltage operation, (2) room-temperature operation, (3) flat band operation, (4) very simple "square" structure, (5) 3 to 12 $\mu$m operation without strong E fields in the laser, (6) coherent transport of carriers on minibands, (7) avoidance of complex SLTRs.

Novel features of cascaded superlattice laser: (1) can increase the useable thickness of a quantum-parallel superlattice stack, (2) improved waveguide-filling factor relative to quantum cascade laser, (3) 4 to 12 $\mu$m operation.

Novel features of staircase laser: (1) 30 to 100 $\mu$m operation, (2) very simple structure, (3) simple electrical injection pump, (4) scaleable for high power output.

Since variations on the foregoing will be readily apparent to the skilled workers in the art, the scope of the invention is to be restricted solely by the terms of the following claims and art recognized equivalents thereof. For example, the above p-i-p arrangement could be an equivalent n-i-n arrangement, and the emitter-down structure would be equivalent to the emitter-up structure as is apparent to such skilled workers in the art.

We claim:

1. A laser comprising:
   (a) a silicon platform;
   (b) a silicon-germanium graded relaxed buffer layer formed upon said silicon platform;
   (c) collector means including a highly doped stably strained SiGe or germanium collector layer formed over said silicon-germanium graded relaxed buffer layer;
   (d) an intrinsic strain-symmetric Ge—Si superlattice positioned over said SiGe or germanium collector layer;
   (e) emitter means including a heavily doped stably strained SiGe emitter layer positioned over said Ge—Si superlattice; and
   (f) foward biasing means coupled to said emitter means and said collector means for enabling light production by said laser.

2. The laser of claim 1 wherein each strain symmetric superlattice period of numerous stacked periods within said superlattice includes a layer of Ge of a thickness of between 8–15 atomic monolayers and a layer of Si having a thickness of between 8–15 atomic monolayers and wherein each Ge layer is in compression and each Si layer is in tension.

3. The laser of claim 1 wherein said superlattice includes a first silicon layer, in contact with said SiGe collector layer, thin enough for carrier tunnelling from the superlattice to the SiGe collector layer, and a second silicon layer, in contact with said SiGe emitter layer, thin enough for tunneling of carriers from the emitter into the superlattice.

4. The laser of claim 2 wherein said superlattice includes a first silicon layer, in contact with said SiGe collector layer, thin enough for carrier tunnelling from the superlattice to the SiGe collector layer, and a second silicon layer, in contact with said SiGe emitter layer, thin enough for tunneling of carriers from the emitter into the superlattice.

5. The laser of claim 1 wherein said silicon-germanium graded relaxed buffer layer is graded up to a maximum of 60 percent Ge.

6. The laser of claim 2 wherein said silicon-germanium graded relaxed buffer layer is graded up to a maximum of 60 percent Ge.

7. The laser of claim 3 wherein said silicon-germanium graded relaxed buffer layer is graded up to a maximum of 60 percent Ge.

8. The laser of claim 4 wherein said silicon-germanium graded relaxed buffer layer is graded up to a maximum of 60 percent Ge.

9. The laser of claim 1 wherein said silicon-germanium relaxed buffer layer has a thickness of between 1–2 microns.

10. The laser of claim 2 wherein said silicon-germanium relaxed buffer layer has a thickness of between 1–2 microns.

11. The laser of claim 3 wherein said silicon-germanium relaxed buffer layer has a thickness of between 1–2 microns.

12. The laser of claim 4 wherein said silicon-germanium relaxed buffer layer has a thickness of between 1–2 microns.

13. The laser of claim 1 wherein said heavily doped Si—Ge emitter layer has a thickness of less than 20 nanometers.

14. The laser of claim 2 wherein said heavily doped Si—Ge emitter layer has a thickness of less than 20 nanometers.

15. The laser of claim 3 wherein said heavily doped Si—Ge emitter layer has a thickness of less than 20 nanometers.

16. A laser comprising:
(a) a silicon platform;
(b) a silicon-germanium or germanium graded relaxed buffer layer formed upon said silicon platform;
(c) silicon-germanium or germanium stably strained collector means formed over said graded relaxed buffer layer;
(d) an intrinsic strain-symmetric Ge—Si superlattice positioned over said germanium collector layer;
(e) emitter means including a stably strained SiGe emitter layer positioned over said Ge—Si superlattice; and
(f) foward biasing means coupled to said emitter means and said collector means for enabling light production by said laser.

17. The laser of claim 16 wherein each strain symmetric superlattice period of numerous stacked periods within said superlattice includes a layer of Ge of a thickness of between 8–15 atomic monolayers and a layer of Si having a thickness of between 8–15 atomic monolayers and wherein each Ge layer is in compression and each Si layer is in tension.

18. The laser of claim 16 wherein said superlattice includes a first silicon layer, in contact with said collector means, thin enough for carrier tunnelling from the superlattice to the collector means, and a second silicon layer, in contact with said emitter layer, thin enough for tunneling of carriers from the emitter into the superlattice.

19. The laser of claim 17 wherein said superlattice includes a first silicon layer, in contact with said collector means, thin enough for carrier tunnelling from the superlattice to the collector means, and a second silicon layer, in contact with said emitter layer, thin enough for tunneling of carriers from the emitter into the superlattice.

20. The laser of claim 16 wherein said silicon-germanium graded relaxed buffer layer is graded up to a maximum of 60 percent Ge.

21. The laser of claim 17 wherein said silicon-germanium graded relaxed buffer layer is graded up to a maximum of 60 percent Ge.

22. The laser of claim 18 wherein said silicon-germanium graded relaxed buffer layer is graded up to a maximum of 60 percent Ge.

23. The laser of claim 19 wherein said silicon-germanium graded relaxed buffer layer is graded up to a maximum of 60 percent Ge.

24. The laser of claim 23 wherein said silicon-germanium relaxed buffer layer has a thickness of between 1–2 microns.

25. A laser comprising:
(a) a silicon platform;
(b) a silicon-germanium graded relaxed buffer layer formed upon said silicon platform;
(c) carrier emitter means and carrier collector means supported by said graded relaxed buffer layer;
(d) an intrinsic strain-symmetric Ge—Si superlattice positioned between said carrier emitter means and said carrier collector means and wherein each strain symmetric superlattice period of numerous stacked periods within said superlattice includes a layer of Ge of a thickness of between 8–15 atomic monolayers and a layer of Si having a thickness of between 8–15 atomic monolayers and wherein each Ge monolayer is in compression and each Si monolayer is in tension; and
(e) electrical biasing means coupled to said emitter means and said collector means for enabling light production by said laser.

26. The laser of claim 25 wherein said superlattice includes a first silicon layer, in contact with said collector means, thin enough for carrier tunnelling from the superlattice to the collector means and a second silicon layer, in contact with said emitter means, thin enough for tunneling of carriers from the emitter means into the superlattice.

* * * * *